US010369663B1

(12) United States Patent
Geerlings et al.

(10) Patent No.: US 10,369,663 B1
(45) Date of Patent: Aug. 6, 2019

(54) LASER PROCESS WITH CONTROLLED POLARIZATION

(71) Applicant: GENTEX CORPORATION, Zeeland, MI (US)

(72) Inventors: Kurtis L. Geerlings, Zeeland, MI (US); Donald L. Bareman, Zeeland, MI (US); David J. Cammenga, Zeeland, MI (US); Niels A. Olesen, Zeeland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 445 days.

(21) Appl. No.: 14/727,668

(22) Filed: Jun. 1, 2015

Related U.S. Application Data

(60) Provisional application No. 62/005,211, filed on May 30, 2014.

(51) Int. Cl.
| | |
|---|---|
| *B23K 26/359* | (2014.01) |
| *H01S 3/00* | (2006.01) |
| *G02B 5/30* | (2006.01) |
| *G02B 26/06* | (2006.01) |
| *B23K 26/00* | (2014.01) |
| *C30B 33/02* | (2006.01) |
| *C30B 29/20* | (2006.01) |

(52) U.S. Cl.
CPC ........ *B23K 26/359* (2015.10); *B23K 26/0039* (2013.01); *C30B 29/20* (2013.01); *C30B 33/02* (2013.01); *G02B 5/3083* (2013.01); *G02B 26/06* (2013.01); *H01S 3/0085* (2013.01)

(58) Field of Classification Search
CPC ............ B23K 26/0087; B23K 26/0039; C30B 29/20; C30B 33/02; G02B 5/3083; G02B 26/06; C03B 29/20; C03B 33/02
See application file for complete search history.

(56) References Cited

U.S. PATENT DOCUMENTS

| | | | | |
|---|---|---|---|---|
| 7,414,786 | B2 * | 8/2008 | Brown | G02B 5/3083 |
| | | | | 359/490.01 |
| 8,842,358 | B2 | 9/2014 | Bareman et al. | |
| 9,102,007 | B2 * | 8/2015 | Hosseini | B23K 26/0057 |
| 2010/0025387 | A1 * | 2/2010 | Arai | B28D 5/00 |
| | | | | 219/121.69 |
| 2011/0100966 | A1 * | 5/2011 | Nagatomo | B23K 26/0087 |
| | | | | 219/121.72 |
| 2011/0248181 | A1 * | 10/2011 | Zigler | G21G 1/10 |
| | | | | 250/423 P |

(Continued)

*Primary Examiner* — Queenie S Dehghan
(74) *Attorney, Agent, or Firm* — Foley & Lardner LLP; Bradley D. Johnson

(57) ABSTRACT

A laser system and method includes control of the direction of polarization of a laser beam that forms laser-induced channels in a substrate along a process path. Control of the direction of polarization is useful while forming laser-induced channels in substrate materials having a crystalline component. An optical element, such as a waveplate, imparts the laser beam with a direction of polarization that is controllable with respect to an axis of the substrate when the substrate is supported by the system for processing. The direction of polarization is changeable and controllable with respect to the direction of the process path and/or a crystalline plane of the substrate via movement of the optical element or the substrate or both.

10 Claims, 4 Drawing Sheets

(56) References Cited

U.S. PATENT DOCUMENTS

2014/0038392 A1* 2/2014 Yonehara .............. H01L 21/304
                                                          438/463
2015/0166394 A1* 6/2015 Marjanovic ........... C03B 33/091
                                                          428/43

* cited by examiner

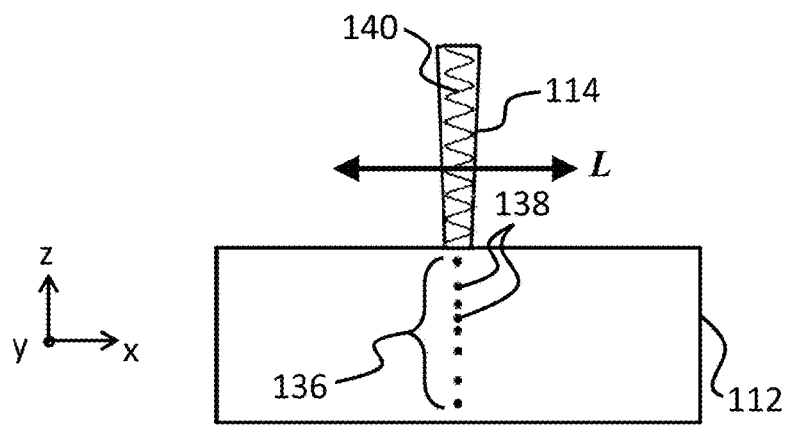
FIG. 5
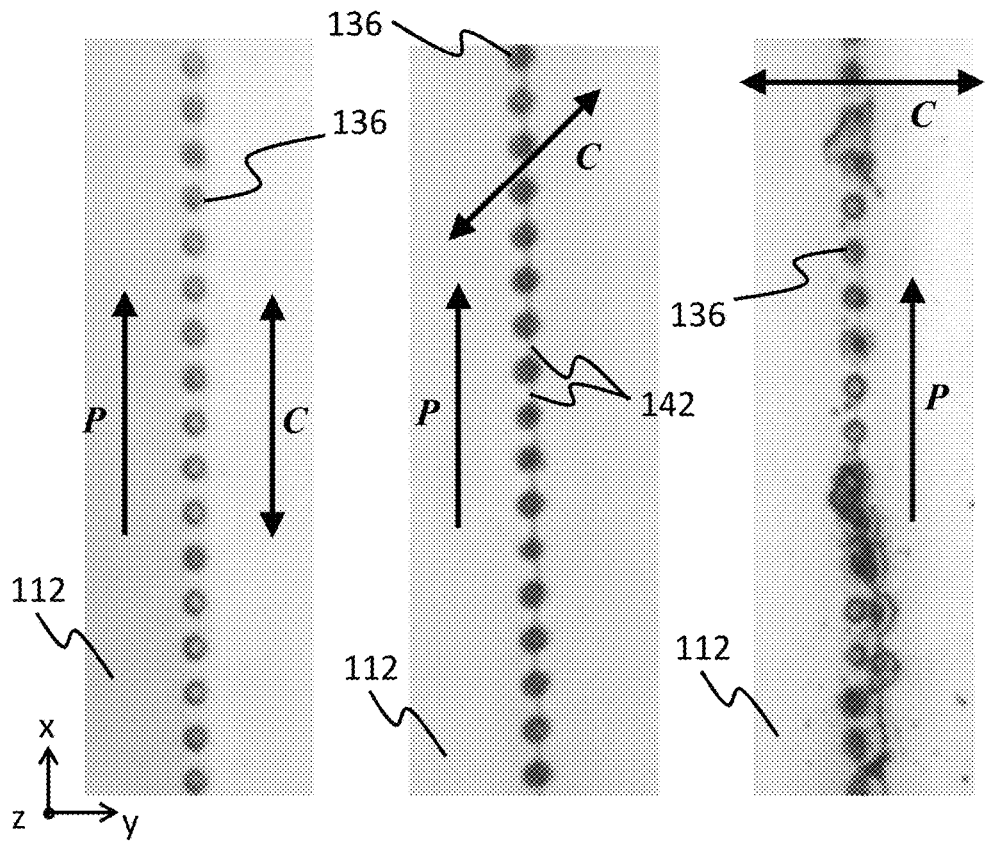
FIG. 6(a)   FIG. 6(b)   FIG. 6(c)

US 10,369,663 B1

LASER PROCESS WITH CONTROLLED POLARIZATION

TECHNICAL FIELD

The present disclosure generally relates to manufacturing processes that use lasers and, more particularly, to processes that use lasers to separate material into two or more separate portions of material.

BACKGROUND

A substrate material can be separated into two or more pieces by forming a plurality of laser-induced channels along a process path located along an intended line of separation, as taught by Bareman et al. in U.S. Pat. No. 8,842,358. A laser-induced channel edge can be formed upon substrate separation and can have a relatively smooth surface without the need for post-processing operations such as grinding.

SUMMARY

In accordance with one or more embodiments, a laser system includes a laser that produces a laser beam and a laser delivery assembly that directs the laser beam toward a substrate. The laser and laser delivery system are together configured to form laser-induced channels in the substrate at a plurality of spaced apart locations along a process path. The laser delivery assembly includes an optical element that imparts the laser beam with a direction of polarization that is controllable with respect to an axis of the substrate when the substrate is supported by the system for processing.

The direction of polarization of the laser beam may be changeable and controllable with respect to an axis of the laser system via movement of the optical element, and/or the orientation of the substrate may be changeable and controllable with respect to an axis of the laser system via movement of the substrate.

An angle between the direction of polarization of the laser beam and the direction of the process path may be controllable during formation of the laser-induced channels along the process path. For example, the angle may be controllable and may vary by no more than ±20 degrees along the process path, the angle may be controllable and constant along the process path, the angle may controllable and in a range from −20 degrees to 20 degrees along the process path, and/or the angle may be controllable to be zero along the process path. Additionally or alternatively, an angle between the direction of polarization of the laser beam and a crystalline plane of the substrate may controllable during formation of the laser-induced channels along the process path.

The laser system may include a waveplate having an optical axis with a controlled orientation with respect to the substrate axis. For example, the system may be configured to rotate the waveplate, the substrate, or both the waveplate and the substrate to change said orientation.

In accordance with one or more embodiments, a method includes the step of directing a laser beam of a laser system toward a substrate that is at least partially transparent to the laser beam, the laser system being configured to form laser-induced channels in the substrate. The method further includes the step of forming laser-induced channels in the substrate at a plurality of spaced apart locations along a process path and the step of controlling the direction of polarization of the laser beam with respect to an axis of the substrate during the step of forming.

The step of controlling may include changing the direction of polarization with respect to an axis of the laser system, with respect to an instant direction of the process path, and/or with respect to a crystalline plane of the substrate. In some embodiments the process path deviates from a straight line and may be curvilinear or include multiple rectilinear segments oriented in different directions. In some embodiments, the substrate comprises or is sapphire. An angle between the direction of polarization and the direction of the process path may be the same along the process path, constant along the process path, and/or controlled within an angular range along the process path. The step of controlling may include passing the laser beam through a waveplate and rotating the waveplate, the substrate, or both.

BRIEF DESCRIPTION OF THE DRAWINGS

Illustrative embodiments will hereinafter be described in conjunction with the appended drawings, wherein like designations denote like elements, and wherein:

FIG. 5 illustrates a laser-induced channel including an array of self-focus damage volumes produced by a laser beam having a direction of polarization;

FIG. 6(a) is a photographic image of a plurality of laser-induced channels formed along a substrate process path with no microcracks between adjacent laser-induced channels;

FIG. 6(b) is a photographic image of a plurality of laser-induced channels formed along a substrate process path with microcracks between adjacent laser-induced channels;

FIG. 6(c) is a photographic image of a plurality of laser-induced channels formed along a substrate process path with microcracks between adjacent laser-induced channels, along with additional cracks and/or other substrate damage;

DETAILED DESCRIPTION OF ILLUSTRATIVE EMBODIMENTS

Figure 1:
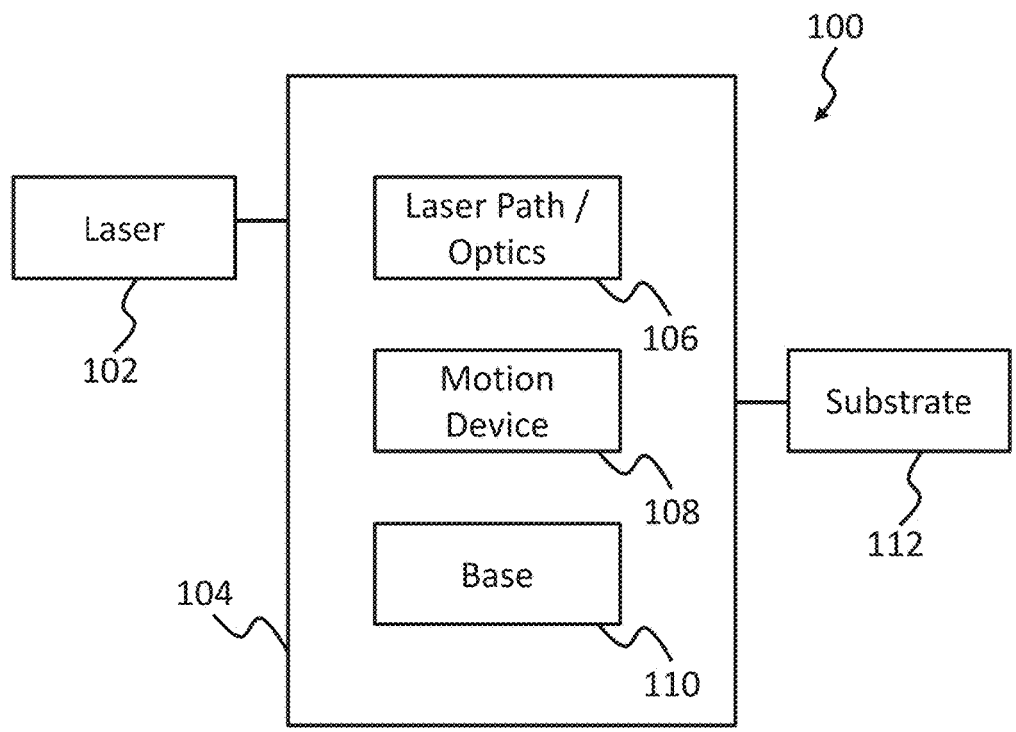
FIG. 1 is a schematic diagram of an illustrative laser system.

With reference to FIG. 1, a laser system 100 is diagrammatically illustrated. The illustrated embodiment includes a laser 102 in optical communication with a laser delivery assembly 104. The laser delivery assembly 104 may include a laser path or optics 106, a laser motion device 108, and a base 110, as shown, and is configured to direct a beam of laser light (i.e., a laser beam) emitted by the laser 102 toward a substrate 112 that is to be processed.

The laser motion device 108 generally operates to change, control, monitor and/or determine the relative location and/or orientation of a portion of the laser beam that impinges the substrate 112 and may do so via appropriate movement of the laser beam and/or the substrate relative to a Cartesian coordinate system and/or about various axes. For instance, the motion device 108 may include servo motors, controllers, sensors, optical elements, and other components configured to change the location and/or orientation at which the laser beam impinges the substrate 112. The motion device 108 may include its own optical elements separate from the laser path or optics 106, which may be arranged between the laser 102 and the motion device.

One process parameter of the laser system 100 that is influenced by the motion device 108 is the speed or velocity at which the laser beam moves with respect to the substrate 112. In some embodiments, the motion device 108 is configured to move the laser beam with respect to the substrate at a constant speed. More particularly, with reference to FIG. 2, the motion device 108 (only a portion of which is illustrated) can be configured to move the laser beam 114 with respect to the substrate 112 so that a laser spot 116 moves along a process path 118 at a constant speed. The laser spot 116 is defined where the laser beam 114 impinges a surface 120 of the substrate 112. Where the substrate 112 is at least partially transparent to the particular wavelength of laser light generated by the laser 102 (e.g., certain glass materials), the impingement surface 120 may be considered an entry surface. As used herein, the speed of the laser spot 116 is the magnitude of the velocity of the laser spot 116 as measured along the process path 118 in the instant direction of movement. In other words, when the laser spot 116 is moving at a constant speed along the process path 118, its speed may be increasing or decreasing in other directions.

Figure 2:
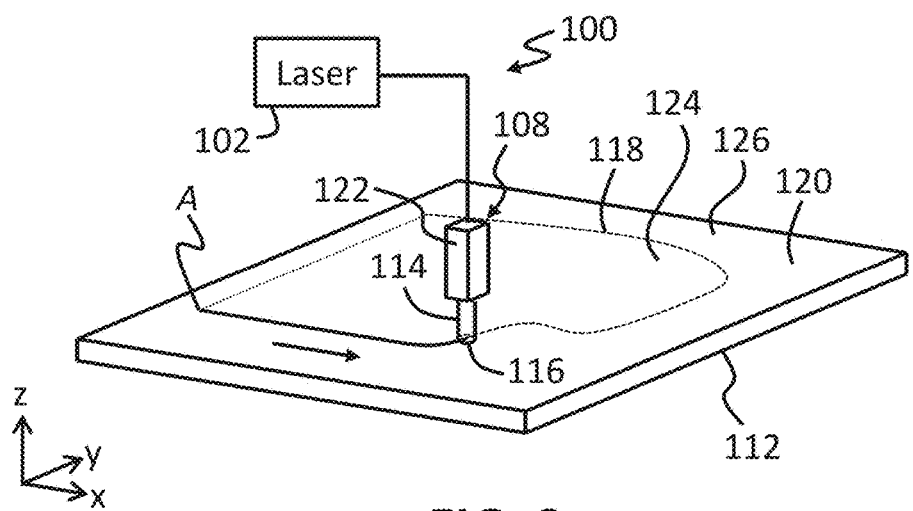
FIG. 2. is a perspective view of an illustrative laser system processing a substrate.

In the example illustrated in FIG. 2, the processed portion of the process path 118 is indicated by a solid line, and the unprocessed portion is indicated by a dotted line. The process starting point is indicated at point A, and the starting direction of movement is in the x-direction. Beginning at point A, the laser spot 116 may move at a constant speed along the process path 118. In this example, this means that the laser spot 116 moves away from point A at the same constant speed in the x-direction and at a different constant speed (i.e., zero) in the y-direction. Where the process path 118 of FIG. 2 curves toward the y-direction, the speed of the laser spot 116 decreases and increases in the respective x- and y-directions while remaining constant along the process path.

Moving the laser beam 114 and laser spot 116 at a constant speed along the process path 118 is advantageous when the laser system 100 is configured to deliver the laser beam to the substrate in pulses at a designated frequency so that the locations at which the laser affects the substrate material are evenly spaced along the process path 118. For instance, with a laser system 100 configured with a pulse frequency of 100 kHz, movement of the laser spot 116 along the process path 118 at a constant speed of 500 mm/sec results in laser pulses delivered to the substrate every 5 μm along the process path 118. Other exemplary speeds are 250 mm/sec and 125 mm/sec, and other exemplary laser pulse frequencies are 200 kHz and 400 kHz. Other laser movement speeds and pulse frequencies are possible, and each can affect the spacing of laser-induced channels or other laser-affected material portions along the process path. It is also possible to vary the speed of the laser spot 116 along the process path 118 and may be possible to change the laser pulse frequency along the process path as well.

In the laser system 100 depicted in FIG. 2, the laser motion device 108 includes an optical assembly 122 through or along which the laser beam 114 travels on its way from the laser 102 to the substrate 112. The motion device 108 may include other non-illustrated components as well, such as a structural portion, a motor portion, and/or other components. The optical assembly 122 includes one or more optical elements. Each optical element is configured to change the direction, size, shape, energy density, energy distribution, or other characteristic of the laser beam 114. Some examples of optical elements include mirrors, reflectors, lenses, magnifiers, diffusers, prisms, and apertures. In some cases, an optical element can provide multiple beam-changing functions. For example, a concave mirror may reflect or change the direction of the laser beam while simultaneously focusing the beam.

Figure 3:
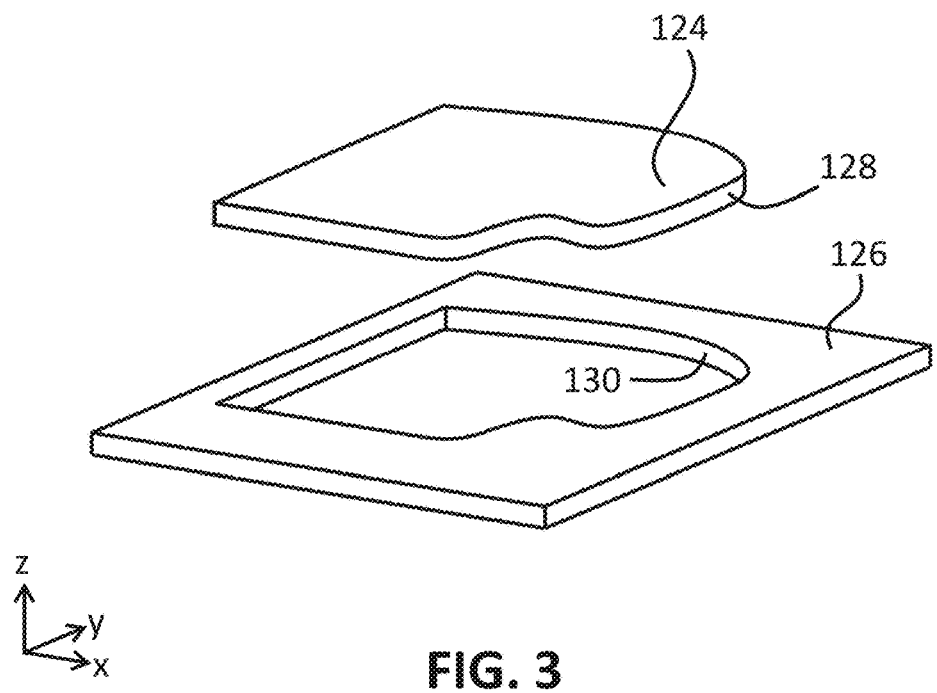
FIG. 3 is a perspective view of first and second portions of the substrate of FIG. 2 after separation.

In embodiments where the substrate 112 is at least partially transparent to the particular wavelength of the laser light from the laser 102, it is possible to form a series of spaced-apart laser-induced channels along the process path 118, with each of the channels extending at least partially through the thickness of the substrate (i.e., in the z-direction of FIG. 2). Laser-induced channels are described in further detail below and are useful to facilitate separation of the substrate 112 into separate portions, such as inner and outer portions 124, 126, along a line of separation defined at least in part by the process path 118. Each laser-induced channel may be characterized by a columnar volume of material within the substrate 112 along which the substrate material has been damaged or otherwise altered. With the application of chemical processes, physical stress, thermal stress, time, or a combination thereof, cracks, (e.g., microcracks) may form between adjacent laser-induced channels along most or all of the length of the process path 118, and the substrate may be severed or separated into two separate portions 124, 126, as shown in FIG. 3. In this example, the process path 118 is a closed path located within the perimeter or boundaries of the starting substrate 112. In other examples, the process path 118 and resulting line of separation extend to at least one edge of the substrate 112.

When portions 124, 126 are initially separated, opposing surfaces or edges 128, 130 are formed along each of the respective separate portions. Each of the newly formed surfaces 128, 130 may be referred to as a separation surface. When separated along a series of laser-induced channels, the newly formed edges 128, 130 may be relatively smooth and absent sharp features, without the need for post-processing such as grinding, even with substrates such as glass, with which grinding of the edges is typically required to remove sharp edges after traditional separation techniques like mechanical scribing. Another characteristic of this type of material separation or singulation is that it is essentially a zero-kerf separation technique. In other words, in contrast to most other laser scribing, cutting, or ablation processes, the laser-induced channel separation process does not remove any measurable amount substrate material—e.g., the outer perimeter of inner portion 124 and the inner perimeter of outer portion 126 are the same size and shape. Certain characteristics of the separation surfaces 128, 130 (e.g., roughness) and of the laser-induced channels along which the separation surfaces are formed can be controlled via one or more laser process parameters. As described further below, the direction of polarization of the laser light is one such process parameter. Controlling the direction of polarization of the laser light while forming laser-induced channels is particularly useful with substrate materials that include a crystalline component. For instance, it has been found that the direction of polarization with respect to the orientation of the crystalline structure can be controlled, changed, optimized, or otherwise used to affect the extent of damage associated with each and between each of the laser-induced channel along the process path.

Figure 4:
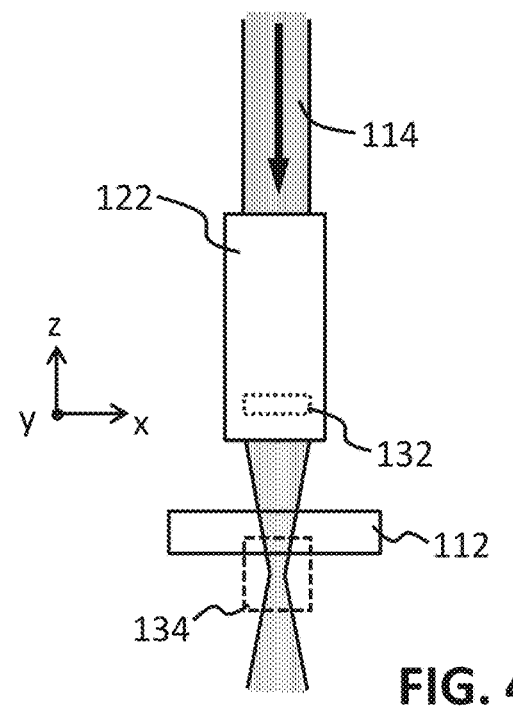
FIG. 4 is a schematic view of a portion of an illustrative laser system, including an optical element.

A brief description of the manner in which laser-induced channels can be formed in a transparent or partially transparent substrate is provided with reference to FIGS. 4 and 5. In the example of FIG. 4, the optical assembly 122 of the laser system includes optical element 132. The optical assembly 122 is configured to receive the laser beam 114, alter a characteristic of the laser beam, and emit the altered laser beam in a direction of light propagation (parallel with the z-axis in this example), such as toward the substrate 112. In the example of FIG. 4, the optical assembly 122 includes a focusing optical element 132, such as a lens, that narrows the laser beam 114, thereby increasing the power density of the laser beam in the z-direction for some distance beyond the optical assembly 122. The power density referred to here is the average power per unit area, where the area is the cross-sectional area of the beam measured in a plane perpendicular with the direction of light propagation (i.e., the x-y plane in FIG. 4). Without the substrate 112 in the path of the laser beam 114, the power density of the beam reaches a maximum along the z-direction in a nominal or geometric focal region 134, beyond which the power density of the beam decreases as the beam diverges or diffuses. As used herein, the terms "power" and "energy" may be used somewhat interchangeably, as skilled artisans will understand that the two terms are related by time or duration. For instance, the energy available from a laser beam of a particular power or wattage within a particular amount of time is generally the product of the laser power and the time. Thus, a timed pulse of laser energy of a known power has an associated amount of available energy.

The energy in a pulse of the laser beam 114 also has a distribution along the direction of light propagation that is a function of distance in the direction of light propagation. In other words, the total amount of energy in a laser pulse of a particular duration propagates through the optical assembly 122 and is distributed at various distances from the last optical element the beam encounters and in various corresponding amounts at each distance. This energy distribution is referred to herein as the focal energy distribution. As used here, a laser pulse refers to both a single, uninterrupted pulse and to a rapid burst of pulses. For instance, a laser operating at a pulse frequency of 100 kHz may deliver a particular amount of energy (i.e., the product of the laser power and total pulse time) 100,000 times per second—i.e., once every 10 µs. Depending on the amount of energy delivered every 10 µs, it may be delivered in a single uninterrupted pulse or in a plurality of pulses on the nanosecond scale.

Where the substrate 112 is at least partially transparent to the particular wavelength of laser light, self-focusing of the light beam can occur due to the Kerr effect. Generally, the Kerr effect is the change in the refractive index of a material in response to an electric field. The optical Kerr effect is the case in which the electric field is due to the light itself. In such cases, the index of refraction of the material increases as a function of increasing light intensity. As the refractive index increases, the beam of light is focused further due to the differential increase in index in the center of the beam. This focusing, called self-focusing, causes a further increase in the intensity, and a corresponding further increase in the index of refraction. In a scenario in which this self-focus process is not limited by another process, the beam of light may cause a catastrophic self-focus event in which an internal volume of the substrate is damaged once a certain intensity threshold is reached. The threshold may be specific to the material composition, and the intensity may be a particular amount of energy per unit mass or volume. Thus, placing a Kerr material in the path of the beam 114 alters the focal energy distribution of the beam away from the nominal condition due to both its linear index of refraction and its non-linear effects.

When the focal energy distribution of the beam is such that the damage threshold of the substrate material is reached at a distance from the final optic that is within the thickness of the substrate, an array of one or more self-focus damage volumes is formed approximately along a line and about an axis in the direction of light propagation (z-direction in FIG. 4). This array of one or more self-focus damage volumes is referred to as a laser-induced damage channel or a laser-induced channel. In some cases, the array of damage volumes is sufficiently large in number and/or the individual damage volumes of the array are sufficiently large in size that the resulting laser-induced channel extends through the entire thickness of the substrate. The spacing between individual damage volumes and/or the size of the individual damage volumes along a particular laser-induced channel may be related to the focal energy distribution. For instance, as the energy density along a focal region decreases, the damage spots that make up the laser-induced channel can have a lower apparent presence (e.g., smaller, spaced farther apart, present over a smaller portion of the substrate thickness, and/or less visible). As the energy density along a focal region increases, the damage spots of the laser-induced channel can have a greater apparent presence (e.g., larger, spaced closer together, present over a larger portion of the substrate thickness and/or more visible). As used here, a focal region is defined between two planes spaced different distances from the final optical element. The focal region may be located generally along the line of light propagation, but the light may be focused along a focal path that deviates from the line of light propagation or the direction of light propagation. The laser-induced channel need not be perpendicular to the surface plane of the optical element nor parallel to the line of light propagation.

FIG. 5 depicts an example of a laser-induced channel 136 comprising a plurality of self-focus damage volumes 138 extending through the thickness of a Kerr material substrate 112. In this particular example, the damage volumes 138 are spaced non-uniformly in the direction of the material thickness. In other examples, the damage volumes 138 can be arranged more uniformly in the direction of material thickness. For instance, the laser optics can be customized or otherwise configured to provide a uniform focal energy distribution at the desired portion of the substrate thickness. Linear ray tracing or non-linear ray tracing can be used to design the laser optics to distribute the available energy in any desired manner to produce damage volumes distributed as desired, whether uniformly, non-uniformly, only partially through the thickness of the substrate, at or away from the entry and/or exit surfaces of the substrate, etc. The size of the individual self-focus damage volumes 138 can be affected or controlled as well, such as by increasing the power in a particular laser pulse to increase the size of the damage volumes or decreasing the power to decrease the size of the damage volumes. The radial size or effective diameter (i.e., width in the x and/or y direction in FIG. 5) of each laser-induced channel can be affected by affecting the size of the damage volumes.

FIG. 5 also depicts the direction of polarization L of the laser beam 114. The electric field component of a single light wave 140 is schematically illustrated. Multiple light waves 140 may combine to form the laser beam 114, which is characterized by a direction of propagation—in the direction of the z-axis of the reference frame in this case. The direction of polarization L is perpendicular to the direction of propagation. The light wave 140 shown in FIG. 5 is polarized in the x-direction of the reference frame. Stated differently, the electric field component of the light wave 140 shown in FIG. 5 oscillates in a plane parallel with the x-z plane of the reference frame.

It should be understood that a light beam is the result of any number of combined waves and that there are an infinite number of different combinations of waves that yield the same resultant light beam. Once multiple light waves are combined to form the beam, the individual waves that were combined are no longer discernible. In other words, the wave 140 of FIG. 5 is used for purposes of illustration of the direction of polarization of the laser beam 114 and may be thought of as a resultant waveform representing the laser beam for this purpose. In this example, the laser beam 114 is linearly polarized in the x-direction. Laser light may be provided by the above-described laser 102 (FIGS. 1 and 2) as a linearly polarized beam 114. The laser system may include a polarizer, for example as part of the laser path 106 or motion device 108 of the laser delivery assembly 104 (see FIG. 1), through which the laser beam 114 passes for polarization. A polarizer absorbs or reflects, depending on the type of polarizer, the portion of the beam with a direction of polarization that does not match the optical axis of the polarizer. A polarizer may be considered an optical element as defined above.

Other types of optical elements that can affect the polarization and/or the direction of polarization of the laser beam include waveplates, such as a half-wave plate ($\lambda/2$ plate) or a quarter-wave plate ($\lambda/4$ plate). The direction of polarization L of linearly polarized light passing through a half-wave plate may be changed depending on the alignment of the direction of polarization of the incoming light with the optical axis of the waveplate. When the direction of polarization of the incoming light is aligned or perpendicular with the optical axis of a half-wave plate, the direction of polarization of outgoing light is the same as the incoming light. When the direction of polarization of the incoming light is off-axis, the direction of polarization of the outgoing light is different from that of the incoming light. With a half-wave plate in particular, the direction of polarization of linearly polarized light passing through the plate normal to the plate surfaces changes by twice the angle between the direction of polarization of the incoming light and the optical axis of the waveplate. For instance, if the angle between the direction of polarization of the incoming light and the optical axis of the waveplate is 45 degrees, the direction of polarization of the outgoing light is changed by 90 degrees. Stated differently, the direction of polarization of the incident light rotates about the propagation axis by twice its angle to the optical axis of the plate.

In the particular case of a quarter-wave plate, linear polarized light is transformed to elliptically polarized light when the incoming direction of polarization is unaligned and non-perpendicular to the optical axis. When the direction of polarization of the incoming light is at a 45 degree angle with the optical axis of the plate, the outgoing light is circularly polarized. Conversely, circularly polarized light can be linearized through a quarter-wave plate. Half-wave and quarter-wave plates are common types of waveplates, but other types of waveplates or non-waveplate optical elements can be used to affect the direction of polarization of the laser beam.

The direction of polarization L of the laser beam 114 can affect the above-described laser-induced channels 136, the individual damage volumes 138, the portion of the substrate between individual laser-induced channels, and/or the separation surfaces 128, 130 (FIG. 3) defined along the process path. This is particularly true with substrate materials that include a crystalline component, crystalline substrates, and single-crystal substrates. For example, the direction of polarization L of the laser light with respect to a crystalline plane of the substrate 112 can affect the size of the self-focus damage volumes 138, the presence or absence of microcracks between adjacent laser-induced channels, and/or the overall amount of damage along the process path.

FIGS. 6(a)-6(c) include photographic images of a top-view (i.e., showing the entry surface) of three different pluralities of laser-induced channels 136 formed along respective process paths of substrates 112. In these examples, each substrate is made from the same type of material and comprises a crystalline component. More specifically, each substrate 112 in the examples of FIGS. 6(a)-6(c) is sapphire, which is a crystalline substrate and which, in this particular example, is a single-crystal sapphire substrate. A crystalline plane of the substrate lies in a known orientation, defining a direction C at the intersection of the crystalline plane and the substrate entry surface. It has been determined that the relative orientations of the crystalline plane of the substrate, the direction of polarization of the laser beam, and/or the instantaneous direction P of the process path can affect certain characteristics of the laser-induced channels. For instance, in FIGS. 6(a)-6(c), each respective plurality of laser-induced channels 136 is formed in the respective substrate 112 using a pulsed laser beam with the same power per pulse, the same number of pulses per individual channel location, the same pulse frequency and speed along the process path (resulting in the same inter-channel spacing), and the direction of polarization of the laser beam in the same direction with respect to the coordinate system (x-y-z) of the laser system. The direction of polarization of the laser beam is not shown in FIGS. 6(a)-6(c), but it changes with respect to the orientation of the crystalline plane by the same amount as the direction of the process path in these examples. Also in the illustrated examples, the referenced crystalline plane of the substrate is perpendicular with the opposite surfaces of the substrate, such that the orientation of the crystalline plane can be described more simply as a lying in direction C.

As indicated in FIGS. 6(a)-6(c), the overall amount of damage associated with the laser-induced channels formed in the substrate is a function of the direction C of the crystalline plane with respect to the direction P of the process path and/or the direction of polarization L of the laser beam. In the example of FIG. 6(b), microcracks 142 are formed between each pair of adjacent laser-induced channels 136 with the crystalline plane in the illustrated offset direction C with respect to the process path direction P and direction of polarization L of the laser beam. Here, the direction C of the crystalline plane is at a 45-degree angle with respect to the direction P of the process path. The processed substrate of FIG. 6(a), where the direction C of the crystalline plane is parallel with the direction P of the process path, does not include such microcracks between adjacent laser-induced channels 136. In the example of FIG. 6(c), where the direction C of the crystalline plane is perpendicular to the direction P of the process path, the substrate 112 includes microcracks between adjacent laser-induced channels 136 along with additional cracks and/or other substrate damage that is not necessarily located along or in alignment with the process path. Overall greater amounts of substrate damage may be generally associated with greater roughness along the separated edges and/or less effort required to separate the substrate portions from each other.

Figure 7:
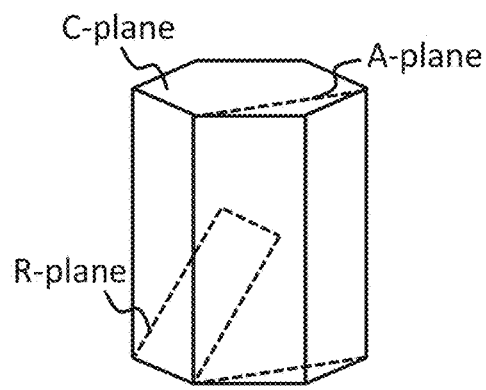
FIG. 7 is an illustrative crystal structure with multiple crystalline planes.

It is noted that FIGS. 6(a)-6(c) are merely illustrative and that the angle between the direction P of the process path and the direction C of the crystalline plane is not necessarily determinative of or correlated to the amount of substrate damage, at least because the direction of polarization of the laser beam is the same in each of the illustrated examples and could be different with respect to the direction P of the process path in other examples. Additionally, in the particular examples of FIGS. 6(a)-6(c), the crystalline plane is the C-plane of the single crystal sapphire, and the results may vary in other examples. For instance, a single crystal sapphire substrate has other crystalline planes, such as an A-plane and an R-plane, as shown in the representative crystal cell structure of FIG. 7. Other crystalline substrates may have other cell or lattice structures that define different crystalline planes.

TABLE I qualitatively summarizes results obtained from forming laser-induced channels along a process path in a single-crystal sapphire substrate with the direction of polarization L of the laser beam at various angles with respect to the C-plane of the sapphire and with the direction P of the process path at various angles with respect to the C-plane of the sapphire. The TABLE I entries indicate the extent of substrate damage associated with the laser-induced channels produced with various combinations of process path angles and polarization angles. The extent of damage is categorized by the presence or absence of microcracks between adjacent laser-induced channels. Where no microcracks were present between adjacent laser-induced channels, such as in the example of FIG. 6(a), the table entry is "none." Where microcracks were present between substantially all adjacent laser-induced channels, such as in the example of FIG. 6(b), the table entry is "all." Where microcracks were present between only some pairs of adjacent laser-induced channels, the table entry is "some." Where microcracks were present between substantially all adjacent laser-induced channels and the substrate had additional chipping or damage in the vicinity of the process path, such as in the example of FIG. 6(c), the table entry is "all +."

TABLE I

| Process Path | Polarization Angle | | | | |
|---|---|---|---|---|---|
| Angle | 0° | 45° | −45° | 90° | Circular |
| 0° | none | some | none | none | none |
| 45° | some/all | none | none | all | none |
| −45° | some/all | some | none | all | none |
| 90° | all + | all | all + | none/some | all |

Figure 8:
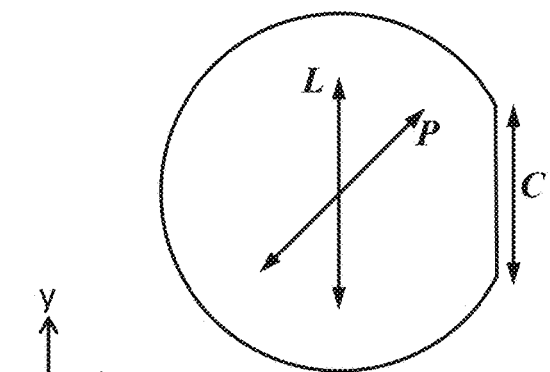
FIG. 8 is a view of a wafer substrate illustrating an example of relative orientations among a crystalline plane (C), the direction of polarization of a laser beam (L), and the direction of a process path (P)

To obtain the results in TABLE I, laser-induced channels were produced in single-crystal sapphire wafers with the C-plane in a known orientation and direction. The "Process Path Angle" is the angle formed between the process path and the direction of the C-plane—i.e., the angle between directions P and C. The "Polarization Angle" is the angle formed between the direction of polarization of the laser beam and the direction of the C-plane—i.e., the angle between directions L and C. FIG. 8 illustrates an example where the polarization angle is 0° and the process path angle is 45°.

For each polarization angle in TABLE I, pluralities of laser-induced channels were produced along straight process paths in the x-direction and the y-direction of the laser system and along process paths at ±45 degrees with respect to the x-y axes. The direction of polarization L of the laser beam was varied using a half-wave plate placed in the path of the laser beam so that the laser beam passed through the waveplate before impinging the substrate. The waveplate was rotated with respect to the laser system to change the direction of polarization L of the laser beam as desired. A quarter-wave plate was used with some samples to change the incoming linearly polarized laser beam to a circularly polarized laser beam. The same focusing optics and laser power were used for all samples, with laser power output selected to differentiate between the process path directions—i.e., too much laser power may cause extensive damage at all process path and laser polarization directions, while too little laser power may not cause microcracks or laser-induced channels at all process path and laser polarization directions.

As confirmed by the TABLE I results, the extent of substrate damage associated with the laser-induced channels is a function of the direction of polarization and/or the direction of the process path with a substrate having a crystalline component. Thus, one possible result, when separating portions of such a substrate along a line of laser-induced channels, is inconsistent roughness along the separated edges if the direction of polarization is not controlled as a process variable. For instance, if the process path is not along a straight line (as in the example of FIGS. 2 and 3), an as-generated laser beam having a constant direction of polarization along the entire process path may produce laser-induced channels with the extent of substrate damage (inter-channel microcracks, damage volume size, etc.) dependent on the process path direction. The resulting separated edges may have different amounts of roughness and/or different amounts of separation effort may be required along different edges.

In the process of producing laser-induced-channels in a closed profile for purposes of singulating a shape as in FIG. 3, the process path 118 ranges from 0° to 360° with respect to crystal orientation. As shown in TABLE I, there may be no constant polarization angle that produces the same level of damage along the process path. When it is desirable to have consistent damage around the entire shape—whether for consistent edge roughness, evenly distributed separation effort, or some other reason—the polarization angle can be varied depending on the instant direction of the process path to achieve the desired extent of damage associated with the laser-induced channels.

In some cases, the result of FIG. 6(b) is preferred along the entire process path, as the microcracks between all laser-induced channels can allow for easy separation and a relatively smooth edge. In other cases, the absence of inter-channel microcracks as in FIG. 6(a) is preferred, such as when the processed substrate must be handled prior to separation. In still other cases, microcracks plus extraneous damage as in FIG. 6(c) is preferred, such as when very low separation effort or high edge roughness is desired. It is also possible that different roughness or separation efforts are desirable along different edges of a separated substrate, or that only a portion of a separated edge is desirably rough or smooth. Controlling the polarization direction of the laser beam can predictably achieve any of these results.

A laser system as set forth above may thus be constructed with special attention paid to the direction of polarization of the laser beam. For instance, the laser system may include an optical element that imparts the laser beam with a direction of polarization that is controllable with respect to an axis of the substrate when the substrate is supported by the system for processing. This substrate axis with respect to which the direction of polarization is controllable may be an axis of the reference frame of the process path, for example. Or it may be a substrate axis aligned with or having a known orientation with respect to a crystalline plane of the substrate. In some embodiments, the system is configured so that the direction of polarization of the laser beam is controllable with respect to an axis of the laser system, such as a stationary base of the laser system. In such a system, a substrate can be mounted to the system for processing with a crystalline plane and/or a process path reference frame axis having a known orientation with respect to the system axis. The system can be configured to control or change the direction of polarization of the laser beam with respect to a desired substrate axis along a process path or to have a different constant direction of polarization for a different process path. The control and/or change can be effected via movement of the optical element (e.g., by rotation, translation, or tilting of the optical element) and/or by movement of the substrate by the system.

In some embodiments, an angle between the direction of polarization of the laser beam and the direction of the process path is controllable during formation of the laser-induced channels along the process path—i.e., while the laser spot moves along the process path. For instance, this angle may be controllable within a range of ±5 degrees, ±10 degrees, ±20 degrees, or ±30 degrees, to list a few examples. In one example, the system is configured so that this angle changes so that the direction of polarization is the same as the instant direction of the process path (i.e., the angle is zero) or the same as the instant direction of the process path within an angular range such as those noted above. In another example, the angle is non-zero and constant or constant within the angular range. The same control and/or change may be exercised with the direction of polarization of the laser beam with respect to a crystalline plane of the substrate—for instance, when the substrate is mounted to the system for processing with the crystalline plane in a desired or known orientation with respect to a system axis.

Figures 9, 10:
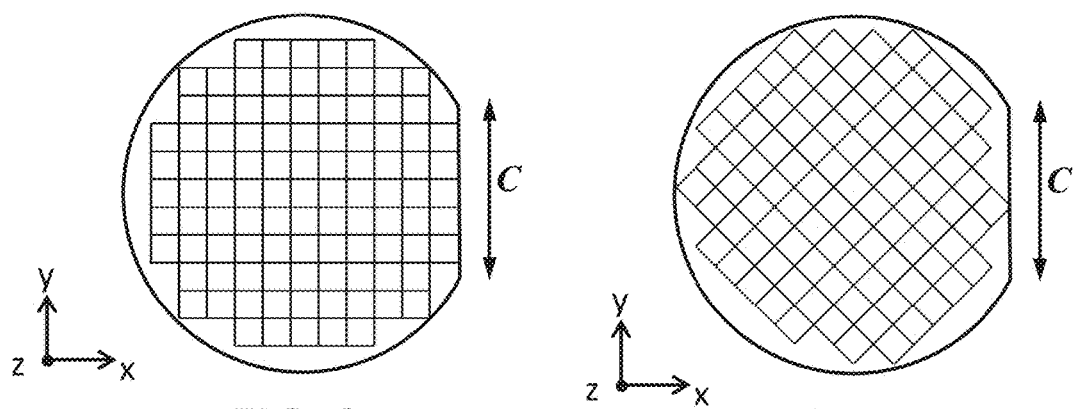
FIG. 9 is an example of a wafer substrate with perpendicular process paths for dicing the wafer.
FIG. 10 is another example of a wafer substrate with perpendicular process paths for dicing the wafer, with the process paths oriented different than those of FIG. 9 with respect to the crystalline plane of the wafer.

The advantages of polarization control are not limited to enclosed profile shapes. Benefits can be realized even with straight line process paths, as is apparent from the some of the differences in the extents of damage in TABLE I between perpendicular process paths. In one example, a single-crystal sapphire wafer is diced by producing laser-induced channels along a plurality of straight process paths in a first direction and along another plurality of straight process paths in a second direction perpendicular to the first direction, as in FIG. 9.

As is apparent from TABLE I, if the polarization angle is not considered in conjunction with the direction of dicing, inconsistent separated edges could be the result. For instance, if the polarization angle is 0° for all process paths, the substrate will be easy to separate and have rough edges along the x-direction (90°) process paths, but will be difficult to separate along the y-direction (0°) process paths. Whereas, if the polarization direction is changed to 90° for the process paths in the x-direction, more uniform damage will be produced in both directions. A constant polarization direction of 90° in both the x- and y-directions would also be more consistent than a constant polarization direction of 0°. With the particular laser power and parameters used to generate the data of TABLE I, orienting the perpendicular process paths as in FIG. 10 with a polarization angle of 90° would achieve the result of FIG. 6(b) along all edges.

In one embodiment, laser-induced channels are formed with the polarization angle and the process path angle substantially the same along the entire process path. Stated differently, the direction of polarization of the laser beam is always aligned with the process path. This technique can produce consistent laser-induced channels and associated substrate damage along the entire process path and corresponds to the 0/0, 45/45, −45/−45, and 90/90 pairings in TABLE I. In this embodiment, sensitivity of the process to the direction of the crystalline plane may also be reduced or removed. With consistency among all process path directions achieved, laser power may then be increased or decreased to adjust the overall amount of consistent damage along the process path or paths.

An embodiment of the laser system includes a waveplate, such as a half-wave plate, located so that the laser beam passes through the waveplate at some location between the laser and the substrate. The waveplate is configured to rotate about the axis of propagation of the laser beam to change the direction of polarization of the laser beam as desired. The waveplate may be an optical element of the optical assembly 122 (FIG. 2) and move together with other optical elements, such as a focusing lens, with respect to the substrate. In another example, the waveplate is located between the substrate and the final optical element of the optical assembly and is not configured for translational movement with respect to the substrate or other laser system components. A laser system controller may control the rotation of the waveplate and allow an operator to select a fixed rotational position for the waveplate, or change the rotational position of the waveplate based on the direction of the process path. In one particular example, the waveplate is a half-wave plate that is configured to rotate by an amount corresponding to one-half the angle of the instantaneous process path direction. Thus, if the process path changes direction by 90 degrees, the waveplate rotates by 45 degrees. In this manner, the angle between the direction of polarization of the laser beam and the process path direction may remain substantially constant (such as 0°) for the length of the process path.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method comprising:
   directing a laser beam of a laser system toward a substrate that is at least partially transparent to the laser beam, the laser system being configured to form laser-induced channels in the substrate, wherein the laser beam passes through a waveplate prior to impinging the substrate;
   forming the laser-induced channels in the substrate at a plurality of spaced apart locations along a process path, wherein an instantaneous direction of the process path relative to a direction of a crystalline plane of the substrate defines a process path angle, and wherein at least a portion of the process path is angled relative to the direction of the crystalline plane of the substrate; and
   selectively rotating at least one of the waveplate or the substrate to control a polarization angle of the laser beam to provide a desired characteristic of the laser-induced channels, wherein the at least one of the waveplate or the substrate is rotated to control the polarization angle based on (i) an instantaneous direction of polarization of the laser beam and (ii) the process path angle of the process path relative to the direction of the crystalline plane of the substrate.

2. The method of claim 1, wherein the process path extends in at least a first direction and a second direction such that the process path angle varies along the process path, and wherein the process path deviates from a straight line along at least one of a curved path or a perpendicular path.

3. The method of claim 1, wherein the substrate comprises sapphire.

4. The method of claim 1, wherein an angle between the instantaneous direction of polarization and the instantaneous direction of the process path is constant along the process path.

5. The method of claim 1, wherein the at least one of the waveplate or the substrate is rotated such that the polarization angle and the process path angle are the same along at least a portion of the process path such that the instantaneous direction of the process path and the instantaneous direction of polarization are parallel.

6. The method of claim 1, wherein the at least one of the waveplate or the substrate is rotated such that the polarization angle and the process path angle are different along at least a portion of the process path such that the instantaneous direction of the process path and the instantaneous direction of polarization are non-parallel.

7. The method of claim 6, wherein the laser-induced channels along at least the portion of the process path include microcracks that extend between adjacent laser-induced channels.

8. The method of claim 5, wherein the laser-induced channels along the portion of the process path do not include microcracks that extend between adjacent laser-induced channels.

9. A method comprising:
   directing a laser beam of a laser system toward a substrate that is at least partially transparent to the laser beam, the laser system configured to form laser-induced channels in the substrate, wherein the laser beam passes through a waveplate prior to impinging the substrate;
   forming the laser-induced channels in the substrate at a plurality of spaced apart locations along a process path, wherein at least a portion of the process path is angled relative to a direction of a crystalline plane of the substrate; and
   selectively rotating at least one of the waveplate or the substrate wherein the at least one of the waveplate or the substrate is rotated to control a polarization angle of the laser beam based on (i) an instantaneous direction of polarization of the laser beam and (ii) an instantaneous direction of the process path relative to the direction of the crystalline plane of the substrate.

10. The method of claim 9, wherein the instantaneous direction of polarization is non-parallel with the instantaneous direction of the process path for at least a portion of the process path.

* * * * *